(12) United States Patent
Hinton et al.

(10) Patent No.: US 12,386,587 B2
(45) Date of Patent: Aug. 12, 2025

(54) VARIABLE WIDTH BARREL SHIFTER

(71) Applicant: L3Harris Technologies, Inc., Melbourne, FL (US)

(72) Inventors: Ryan W. Hinton, Erda, UT (US); Scott C. Smedley, West Jordan, UT (US); Joshua D. Gunn, Farmington, UT (US)

(73) Assignee: L3Harris Technologies, Inc., Melbourne, FL (US)

( * ) Notice: Subject to any disclaimer, the term of this patent is extended or adjusted under 35 U.S.C. 154(b) by 144 days.

(21) Appl. No.: 17/725,432

(22) Filed: Apr. 20, 2022

(65) Prior Publication Data

US 2023/0342110 A1    Oct. 26, 2023

(51) Int. Cl.
*G06F 5/01*    (2006.01)

(52) U.S. Cl.
CPC .................. *G06F 5/015* (2013.01)

(58) Field of Classification Search
CPC ............... G06F 5/00–017; G06F 5/085; G06F 7/74–762
See application file for complete search history.

(56) References Cited

U.S. PATENT DOCUMENTS

| | | | | |
|---|---|---|---|---|
| 5,646,873 A * | 7/1997 | Shimazawa | ............. | G06F 5/015 |
| | | | | 708/209 |
| 6,278,403 B1 * | 8/2001 | Peng | ........................ | G01S 19/37 |
| | | | | 342/357.77 |
| 6,336,180 B1 * | 1/2002 | Long | ..................... | G06F 9/3879 |
| | | | | 712/E9.067 |
| 8,151,160 B1 * | 4/2012 | Andreev | ........... | H03M 13/6502 |
| | | | | 714/752 |
| 8,707,123 B2 | 4/2014 | Liu et al. | | |
| 9,548,759 B1 * | 1/2017 | Rad | .................... | H03M 13/6516 |
| 2008/0243974 A1 | 10/2008 | Paumier et al. | | |
| 2010/0272227 A1 | 10/2010 | Dielissen | | |
| 2011/0191650 A1 | 8/2011 | Yokokawa | | |

(Continued)

FOREIGN PATENT DOCUMENTS

EP     2333961 A1    6/2011

OTHER PUBLICATIONS

Kumar, Rajeev. "Design of Variable Width Barrel Shifter for High Speed Processor . . . " Researchgate.Net, 2012, www.researchgate.net/publication/266172336_Design_of_Variable_Width_Barrel_Shifter_for_High_Speed_Processor_Architecture. (Year: 2012).*

(Continued)

*Primary Examiner* — Jyoti Mehta
*Assistant Examiner* — Huy Duong
(74) *Attorney, Agent, or Firm* — Fox Rothschild LLP; Carol E. Thorstad-Forsyth

(57) ABSTRACT

A variable width barrel shifter. The variable width barrel shifter includes a first barrel shifter configured to receive a data vector of width M as input. The variable width barrel shifter further includes a second barrel shifter configured to receive the data vector of width M as input. The variable width barrel shifter includes an element-wise multiplexer coupled to the first and second barrel shifters. The element-wise multiplexer is configured to provide a shifted output of the data vector of width M by including a first portion of output from the second barrel shifter and a second portion of output from the first barrel shifter.

14 Claims, 4 Drawing Sheets

(56) References Cited

U.S. PATENT DOCUMENTS

2013/0173994 A1* 7/2013 Liu .................... H03M 13/1117
                                                    714/E11.034
2015/0229330 A1   8/2015 Motozuka et al.

OTHER PUBLICATIONS

C. Studer, N. Preyss, C. Roth and A. Burg, "Configurable high-throughput decoder architecture for quasi-cyclic LDPC codes," 2008 42nd Asilomar Conference on Signals, Systems and Computers, Pacific Grove, CA, USA, 2008, pp. 1137-1142, doi: 10.1109/ACSSC.2008.5074592. (Year: 2008).*
Chen et al., "QSN—A Simple Circular-Shift Network for Reconfigurable Quasi-Cyclic LDPC Decoders", IEEE Transactions on Circuits and Systems II: Express Briefs, vol. 57, No. 10, Oct. 10, 2010, pp. 782-786.
Studer C. et al., "Configurable high-throughput decoder architecture for quasi-cyclic LDPC codes", 2008 42nd Asilomar Conference on Signals, Systems and Computers, 2008, pp. 1137-1142.
European Search Report received for EP Patent Application No. 23162451.1, mailed on Jul. 4, 2023, 13 pages.

* cited by examiner

VARIABLE WIDTH BARREL SHIFTER

BACKGROUND

Background and Relevant Art

A barrel shifter is a hardware device configured to circularly rotate an input vector by a specified number of values. For example, the input vector may be a vector of bits, and the barrel shifter shifts the bits by a set shift. For example, consider the bite-wise vector [$b_0$, $b_1$, $b_2$, $b_3$, $b_4$, $b_5$, $b_6$, $b_7$, $b_8$, $b_9$, $b_{10}$, $b_{11}$]. If this vector were input into a 12 value barrel shifter configured with a 3 value shift, the output of the barrel shifter is [$b_9$, $b_{10}$, $b_{11}$ $b_0$, $b_1$, $b_2$, $b_3$, $b_4$, $b_5$, $b_6$, $b_7$, $b_8$].

Barrel shifters are particularly useful for Low-density parity-check (LDPC) systems. Typically, the barrel shifter width is selected based on the code structure for the LDPC system. Previously, many different code families used the same (or a sufficiently related shifter width) such that a single barrel shifter could be used in a given system, even when using different code families.

However, newer technologies, such as for example, modern 5G radio LDPC code-based systems require multiple different and unrelated barrel shifter widths. This results in significant increases in hardware size, as different individual barrel shifters are implemented for each use case, and a commensurate reduction in throughput.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a variable width barrel shifter. The variable width barrel shifter includes a first barrel shifter configured to receive a data vector of width M as input. The variable width barrel shifter further includes a second barrel shifter configured to receive the data vector of width M as input. The variable width barrel shifter includes an element-wise multiplexer coupled to the first and second barrel shifters. The element-wise multiplexer is configured to provide a shifted output of the data vector of width M by including a first portion of output from the second barrel shifter and a second portion of output from the first barrel shifter.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein are able to implement a variable-width barrel shifter. This is accomplished by coupling two conventional barrel shifters (i.e., first and second barrel shifters) to an element-wise multiplexer. The barrel shifters are sized so as to have a width that is the maximum width for the variable-width barrel shifter. In this example, this width size is referred to as N. The barrel shifters receive a data vector of width M as input, where M is equal to, or smaller than N. The element-wise multiplexer provides a shifted output of the data vector of width M by including a first portion of output from the first barrel shifter and second portion of output from the second barrel shifter.

Figure 1:
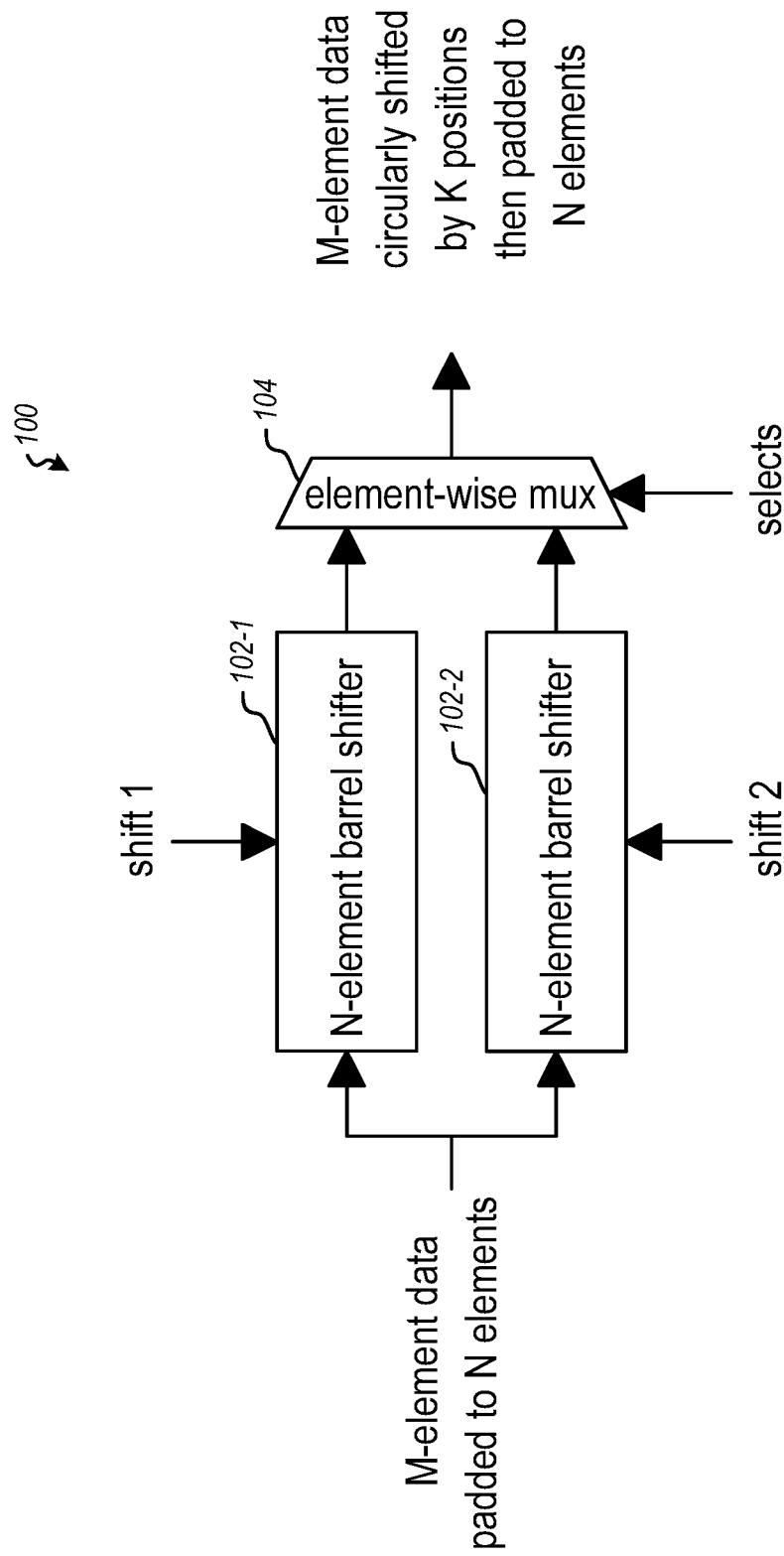
FIG. 1 illustrates a variable width barrel shifter.

A general example is illustrated in FIG. 1. FIG. 1 illustrates a variable-width barrel shifter 100. The variable-width barrel shifter 100 includes two conventional barrel shifters 102-1 and 102-2. As illustrated in this example, each of the barrel shifters 102-1 and 102-2 are N-element barrel shifters, meaning that they are configured to receive as input an N-element vector. Note that while the example in FIG. 1 can be conceptualized as operating on N-bit vectors, it should be appreciated that more generally embodiments may be implemented to operate on N-element vectors, where the elements could be any one of a number of different types of elements, including bits, bytes, symbols, numbers, floating point numbers, letters, strings, or other elements. As discussed previously, the barrel shifters 102-1 and 102-2 are selected where N is the maximum width size of the variable-width barrel shifter 100.

The barrel shifters 102-1 and 102-2 each have a variable-width controlled by a shift input illustrated as shift 1 and shift 2 respectively. Thus, each of the barrel shifters 102-1 and 102-2 have a shift that is independent of the other.

The barrel shifters 102-1 and 102-2 are coupled to an element-wise multiplexer 104. The element-wise multiplexer 104 can select, per element, an element from the first barrel shifter 102-1 or from the second barrel shifter 102-2. In this way, the element-wise multiplexer 104 can produce an output based on elements from both the first barrel shifter 102-1 and the second barrel shifter 102-2. The barrel shifters 102-1 and 102-2 receive a data vector of width M elements padded to N elements. Each barrel shifter shifts the data vector according to its respective shift input (i.e., shift 1 and shift 2, respectively). Outputs from the barrel shifters 102-1 and 102-2 are input into the element-wise multiplexer 104, which selects appropriate bits from each barrel shifter to provide a shifted output of the data vector of width M by including a first portion of output from the first barrel shifter and second portion of output from the second barrel shifter, along with padded elements to output an N element output.

Figure 2:
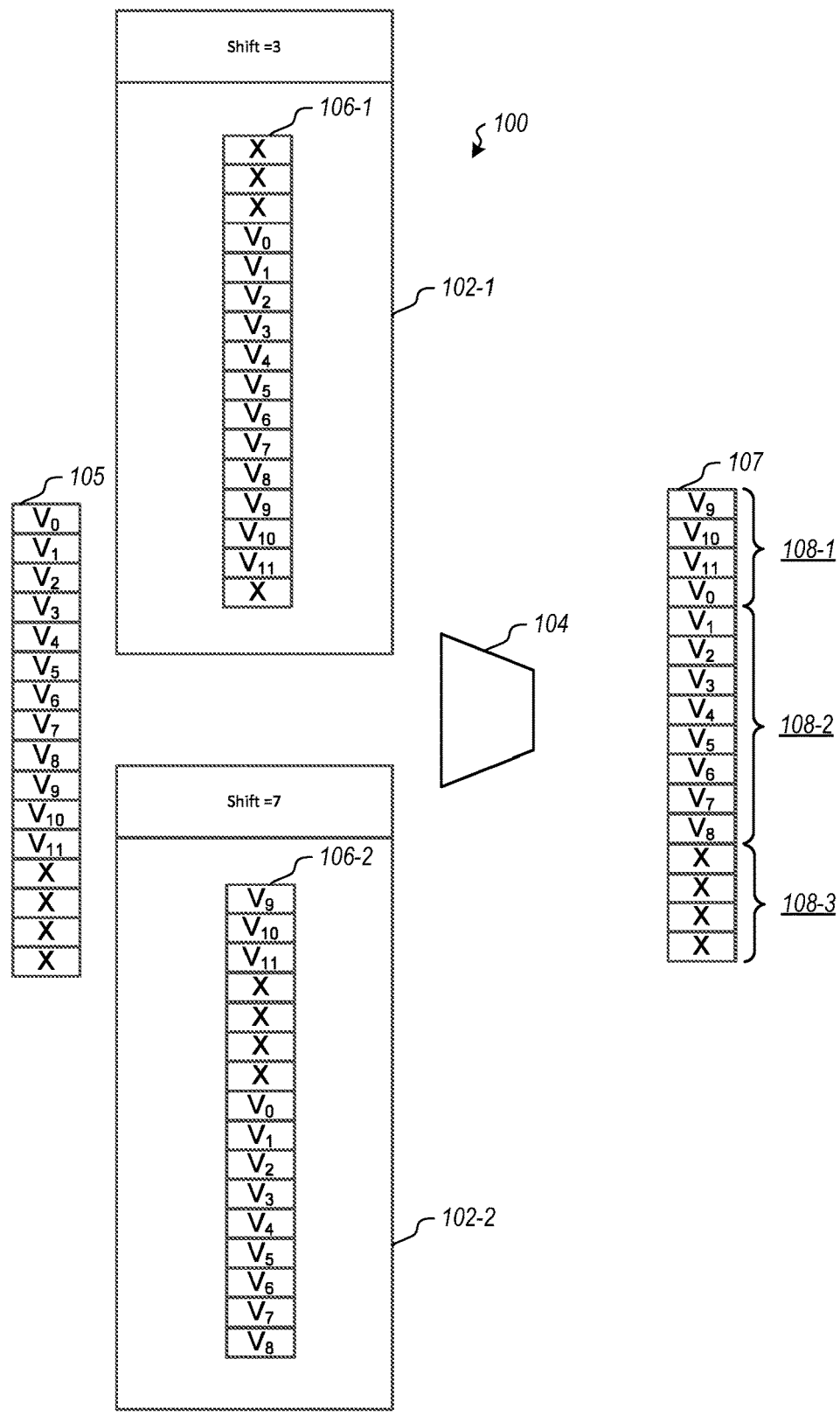
FIG. 2 illustrates a specific use example of the variable width barrel shifter.

As noted previously, the first and second barrel shifters 102-1 and 102-2 are width N. A specific example of this is illustrated in FIG. 2. In the example in FIG. 2, a M-bit vector $[v_0, v_1, v_2, v_3, v_4, v_5, v_6, v_7, v_8, v_9, v_{10}, v_{11}]$ is shown. This M-bit (where M=12) vector is padded to N bits (where N=16) such that a padded vector 105 $[v_0, v_1, v_2, v_3, v_4, v_5, v_6, v_7, v_8, v_9, v_{10}, v_{11}$ x, x, x, x] is input into the first and second barrel shifters 102-1 and 102-2 respectively. The 'x's in the padded vector are "don't care" values and it is irrelevant what actual values are represented by the 'x's in the padded vector.

In the example illustrated in FIG. 2, the shift of the variable-width barrel shifter 100 is size K. In the example illustrated in FIG. 2, K=3. Note that this is just for example purposes, and K could be any relevant shift depending on the functionality to be achieved. In some embodiments, to accomplish this shift for the variable barrel shifter 100 as a whole, the first barrel shifter 102-1 shifts by K and the second barrel shifter 102-2 shifts by ((K-M) mod N). In this particular barrel shifter design, this will result in any elements that 'wrap around' in the variable barrel shifter 100 to 'wrap around' in the second barrel shifter 102-2 and elements that do not wrap around in the variable barrel shifter 100 to not 'wrap around' in the first barrel shifter 102-1. As will be illustrated below, this facilitates simple selection of elements for output by the element-wise multiplexer 104.

Thus, in the example illustrated where K=3, M=12, N=16, then (K-M) mod N)=7. Thus, as illustrated in FIG. 2, shift 1 for the first barrel shifter 102-1 is 3 and shift 2 for the second barrel shifter 102-2 is 7. This results in the first barrel shifter 102-1 outputting a first shifted vector 106-1 [x, x, x, $v_0, v_1, v_2, v_3, v_4, v_5, v_6, v_7, v_8, v_9, v_{10}, v_{11}$ x] to the element-wise multiplexer 104 and the second barrel shifter 102-2 outputting a second shifted vector 106-2 [$v_9, v_{10}, v_{11}$ x, x, x, x, $v_0, v_1, v_2, v_3, v_4, v_5, v_6, v_7, v_8$] to the element-wise multiplexer 104.

As noted previously, the element-wise multiplexer 100 is configured to provide a shifted output of the data vector of width M by including a first portion of output 108-1 from the second barrel shifter 102-2 and a second portion of output 108-2 from the first barrel shifter. In some embodiments, the first portion of output 108-1 from the second barrel shifter 102-2 constitutes the first K (i.e., the shift size) elements of the output from the second barrel shifter 102-2 (in this example, elements 0, 1, and 2 of the second shifted vector 106-2) that are selected and output as the first K elements of the output vector 107 from the element-wise multiplexer 104. The second portion of output 108-2 from the first barrel shifter comprises a subsequent M-K elements (in this example, M-K=9) by the element-wise multiplexer 104 selecting elements beginning at the $K^{th}+1$ element (thus, in this example, elements 3, 4, 5, 6, 7, 8, 9, 10, and 11) of the first shifted vector 106-1 from the first barrel shifter 102-1 and outputting these elements from the element-wise multiplexer 104. Thus, the element-wise multiplexer is configured to select the first contiguous K elements of the second shifted vector 106-2 from the second barrel shifter 102-2 and M-K contiguous elements beginning at the $K^{th}+1$ element of the first shifted vector 106-1 from the first barrel shifter 102-1 to generate the output vector 107. The remaining N-M elements 108-3 are padding such that it is irrelevant what values are in those elements. Thus, in this particular example, the element-wise multiplexer 104 outputs the vector [$v_9, v_{10}, v_{11}, v_0, v_1, v_2, v_3, v_4, v_5, v_6, v_7, v_8$, x, x, x, x].

In some embodiments, the variable barrel shifter 100 may have particular characteristics that are particularly suitable for certain application. For example, in the LDPC realm, it may be useful to implement variable-width barrel shifters that are only able to shift by a power of 2. In particular, fewer control inputs would be needed into the first and second barrel shifters 102-1 and 102-2 while still being able to implement all useful shifts in the variable-width barrel shifter 100 for the particular application. In particular, control bits could be reduced by about half by only allowing for shifts by a power of 2.

Similarly, in some embodiments, the variable-width barrel shifter may be implemented where M is a power of 2.

Note that in embodiments where N=M, all elements output by the element-wise multiplexer 104 can be easily selected from a single barrel shifter. Indeed, in this case, if all elements are selected from the first barrel shifter 102-1, in the format output from the first barrel sifter 102-1, the desired output will be obtained.

Figure 3:
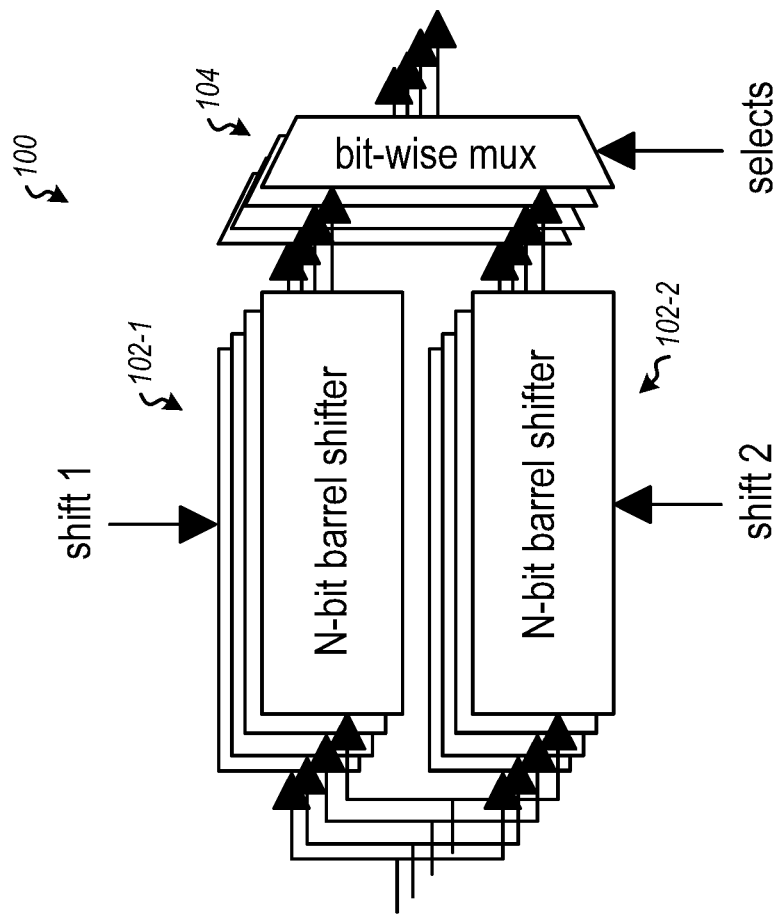
FIG. 3 illustrates an implementation of the variable width barrel shifter using bit-wise components.

Note that as discussed previously, elements in a vector may be of any format. However, it is often simpler to implement barrel shifters and multiplexers where elements are single bits. In practice, as illustrated in FIG. 3, multi-bit elements can be implemented by implementing multiple bit-wise elements as appropriate. In particular, FIG. 3 illustrates a plurality of N-bit barrel shifters coupled to a plurality of bit-wise multiplexers.

However, a single set of controls can be used. Thus, while FIG. 3 illustrates multiple different inputs (e.g., the different bits of a multi-bit words in an input vector), different N-bit barrel shifters, different bit-wise multiplexers, and different outputs (e.g., the different bits of a multi-bit output words in an output vector), only a single set of control inputs are used for duplicated components. Thus, only single shift control input signal is needed for the first barrel shifter 102-1, even though it is implemented using multiple bit-wise barrel shifters. The same shift size is input into each bit-wise barrel shifter. Similarly, only single shift control input signal is needed for the second barrel shifter 102-2, even though it is implemented using multiple bit-wise barrel shifters. The same shift size is input into each bit-wise barrel shifter. Similarly, the select inputs used for the bit-wise multiplexers of the element wise multiplexer 104 is the same across all bit-wise multiplexers.

Note that while the example illustrated in FIG. 3 shows four sets of components to support 4-bit elements, embodiments may include many more sets of components as appropriate. Further, different element sizes can be supported by including a number of sets of components up to an expected maximum element size, and where unneeded bits of the elements can simply be set to 'don't care' values similar to how 'don't care' values have been used above with respect to unneeded elements in the padded vector.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 4:
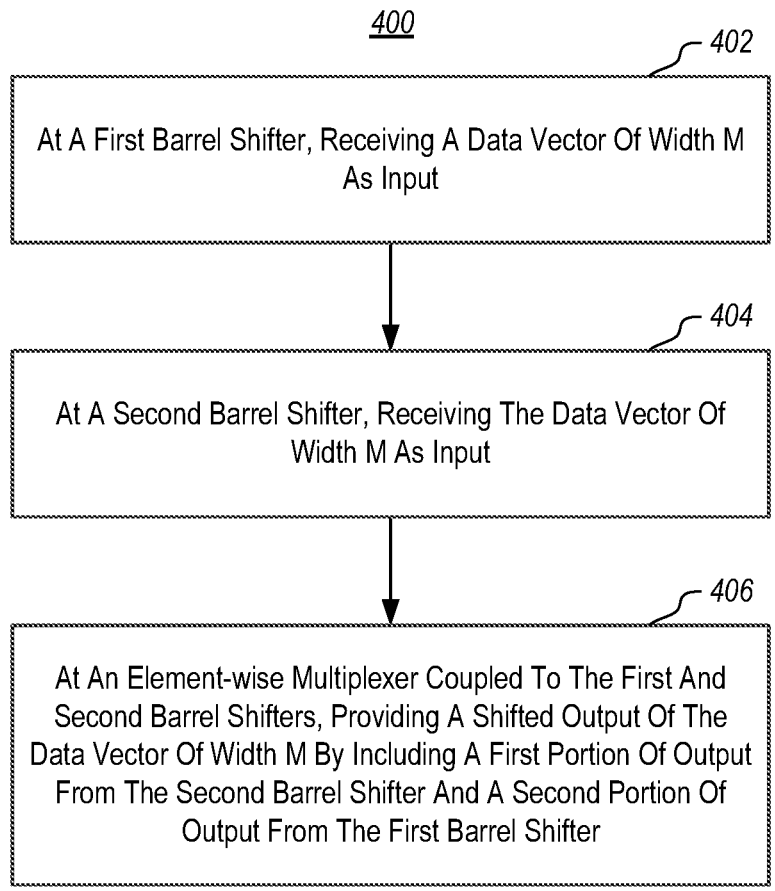
FIG. 4 illustrates a method of performing variable width barrel shifting.

Referring now to FIG. 4, a method 400 is illustrated. The method 400 includes acts for performing variable width barrel shifting. The method 400 includes, at a first barrel shifter, receiving a data vector of width M as input (act 402). The method 400 further includes, at a second barrel shifter, receiving the data vector of width M as input (act 404). The method 400 further includes, at an element-wise multiplexer coupled to the first and second barrel shifters, providing a shifted output of the data vector of width M by including a first portion of output from the second barrel shifter and a second portion of output from the first barrel shifter (act 406).

The method 400 may be practiced where the first portion of output from the second barrel shifter is contiguous and the second portion of output from the first barrel shifter is contiguous.

The method 400 may be practiced where the variable-width barrel shifter shifts by a power of 2.

The method 400 may be practiced where M is a power of 2.

The method 400 may be practiced where receiving the data vector of width M comprises receiving the data vector of width M padded to width N. In some such embodiments, the first and second barrel shifters are width N and a shift of the variable-width barrel shifter is width K. The first barrel shifter shifts by K and the second barrel shifter shifts by ((K-M) mod N).

In some embodiments, the first and second barrel shifters are width N and a shift of the variable-width barrel shifter is width K. The first portion of output from the second barrel shifter constitutes the first K elements output from the first barrel shifter. The second portion of output from the first barrel shifter comprises a subsequent M-K elements, beginning at the $K^{th}+1$ element output from the first barrel shifter.

In some embodiments, where vector elements are multi-bit, the first barrel shifter is implemented using a first plurality of N-bit barrel shifters and the second barrel shifter is implemented using a second plurality of N-bit barrel shifters, and the element-wise multiplexer is implemented using a plurality of bit-wise multiplexers.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A variable-width barrel shifter comprising:
a first barrel shifter configured to receive a data vector of width M as input;
a second barrel shifter configured to receive the data vector of width M as input, wherein the first and second barrel shifters are width N, and wherein the first and second barrel shifters are configured to receive the data vector of width M padded to width N; and
an element-wise multiplexer coupled to the first and second barrel shifters, wherein the element-wise multiplexer is configured to provide a shifted output of the data vector of width M by including a first portion of output from the second barrel shifter and a second portion of output from the first barrel shifter; and
control bit inputs that input into the variable-width barrel shifter that allow for variable-width shifting;
wherein a shift of the variable-width barrel shifter is width K, the first barrel shifter is configured to shift by K and the second barrel shifter is configured to shift by ((K-M) mod N); and
wherein the first barrel shifter is configured to right-shift elements of the data vector and the second barrel shifter is configured to right-shift elements of the data vector.

2. The variable-width barrel shifter of claim 1, wherein the first portion of output from the second barrel shifter is contiguous and the second portion of output from the first barrel shifter is contiguous.

3. The variable-width barrel shifter of claim 1, wherein M is a power of 2 or the control bit inputs allow the variable-width barrel shifter to only be able to shift by a power of 2.

4. The variable-width barrel shifter of claim 1, wherein the shifted output comprises the first portion followed by the second portion,
the first portion of output from the second barrel shifter constitutes a first K elements output from the second barrel shifter, and
the second portion of output from the first barrel shifter comprises a M-K elements, beginning at the $K^{th}+1$ element output from the first barrel shifter.

5. The variable-width barrel shifter of claim 1, wherein:
the first barrel shifter is implemented using a first plurality of N-bit barrel shifters;
the second barrel shifter is implemented using a second plurality of N-bit barrel shifters; and
the element-wise multiplexer is implemented using a plurality of bit-wise multiplexers.

6. A method of performing variable-width barrel shifting, the method comprising:
at a first barrel shifter, receiving a data vector of width M as input;
at a second barrel shifter, receiving the data vector of width M as input;
wherein the first and second barrel shifters are width N, and wherein the first and second barrel shifters are configured to receive the data vector of width M padded to width N;
receiving input at control bit inputs that allow for facilitating a plurality of different shifts; and
at an element-wise multiplexer coupled to the first and second barrel shifters, providing a shifted output of the data vector of width M by including a first portion of output from the second barrel shifter and a second portion of output from the first barrel shifter;
wherein a shift of the variable-width barrel shifter is width K, the first barrel shifter is configured to shift by K and the second barrel shifter is configured to shift by ((K-M) mod N); and
wherein the first barrel shifter is configured to right-shift elements of the data vector and the second barrel shifter is configured to right-shift elements of the data vector.

7. The method of claim 6, wherein the first portion of output from the second barrel shifter is contiguous and the second portion of output from the first barrel shifter is contiguous.

8. The method of claim 6, wherein M is a power of 2 or the control bit inputs allow the variable-width barrel shifter to only be able to shift by a power of 2.

9. The method of claim 6, wherein the first portion of output from the second barrel shifter constitutes a first K elements output from the second barrel shifter and the second portion of output from the first barrel shifter comprises a subsequent M-K elements, beginning at the $K^{th}+1$ element output from the first barrel shifter.

10. The method of claim 6, wherein:
the first barrel shifter is implemented using a first plurality of N-bit barrel shifters;
the second barrel shifter is implemented using a second plurality of N-bit barrel shifters; and
the element-wise multiplexer is implemented using a plurality of bit-wise multiplexers.

11. A non-transitory computer readable storage medium comprising computer executable instructions that when executed by one or more processors cause the one or more processors to perform the following:
at a first barrel shifter, receiving a data vector of width M as input;
at a second barrel shifter, receiving the data vector of width M as input; wherein the first and second barrel shifters are width N and wherein the first and second barrel shifters are configured to receive the data vector of width M padded to width N;
receiving input at control bit inputs that allow for a plurality of different shifts; and
at an element-wise multiplexer coupled to the first and second barrel shifters, providing a shifted output of the data vector of width M by including a first portion of output from the second barrel shifter and a second portion of output from the first barrel shifter;
wherein a shift of the variable-width barrel shifter is width K, the first barrel shifter is configured to shift by K and the second barrel shifter is configured to shift by ((K-M) mod N); and
wherein the first barrel shifter is configured to right-shift elements of the data vector and the second barrel shifter is configured to right-shift elements of the data vector.

12. The non-transitory computer readable storage medium of claim 11, wherein the first portion of output from the second barrel shifter constitutes the first K elements output from the second barrel shifter and the second portion of output from the first barrel shifter comprises a subsequent M-K elements, beginning at the $K^{th}+1$ element output from the first barrel shifter.

13. The non-transitory computer readable storage medium of claim 11, wherein the first portion of output from the second barrel shifter is contiguous and the second portion of output from the first barrel shifter is contiguous.

14. The non-transitory computer readable storage medium of claim 11, wherein M is a power of 2 or the control bit inputs allow the variable-width barrel shifter to only be able to shift by a power of 2.

* * * * *